(12) United States Patent
Tawarayama

(10) Patent No.: US 8,067,757 B2
(45) Date of Patent: Nov. 29, 2011

(54) EXTREME ULTRAVIOLET LIGHT SOURCE APPARATUS AND METHOD OF ADJUSTING THE SAME

(75) Inventor: Kazuo Tawarayama, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 12/696,759

(22) Filed: Jan. 29, 2010

(65) Prior Publication Data

US 2010/0193712 A1    Aug. 5, 2010

(30) Foreign Application Priority Data

Jan. 30, 2009    (JP) ................. 2009-020690

(51) Int. Cl.
G01N 21/33    (2006.01)
G01N 21/00    (2006.01)
H05H 1/24    (2006.01)
(52) U.S. Cl. ............... 250/504 R; 250/365; 250/372; 315/111.21
(58) Field of Classification Search .......... 250/504 R, 250/365, 372; 315/111.21
See application file for complete search history.

(56) References Cited

U.S. PATENT DOCUMENTS

| | | | |
|---|---|---|---|
| 2010/0140512 A1* | 6/2010 | Suganuma et al. | 250/504 R |
| 2010/0192973 A1* | 8/2010 | Ueno et al. | 134/1.1 |
| 2010/0288937 A1* | 11/2010 | Watanabe et al. | 250/372 |

FOREIGN PATENT DOCUMENTS

| | | |
|---|---|---|
| JP | 2004-214656 | 7/2004 |
| JP | 2007-5542 | 1/2007 |
| JP | 2007-129103 | 5/2007 |
| JP | 2008-108599 | 5/2008 |

OTHER PUBLICATIONS

Tawarayama, K. et al., "Evaluation Results for Selete's Exposure Tool—Impact of the Source Performance-," Proc. of SPIE, vol. 6921, pp. 69212V-1 to 69212V-8, (2008).
Journal of Plasma and Fusion Research (Mar. 2003), 79:217-262.

* cited by examiner

*Primary Examiner* — Nikita Wells
(74) *Attorney, Agent, or Firm* — Finnegan, Henderson, Farabow, Garrett & Dunner, L.L.P.

(57) ABSTRACT

An extreme ultraviolet light source apparatus includes a main body including a supply section to which an extreme ultraviolet radiation seed is supplied, and an emission part configured to emit extreme ultraviolet, an excitation unit provided in the main body and configured to generate a plasma by exciting the extreme ultraviolet radiation seed, an optical condensing unit provided in the main body and configured to converge extreme ultraviolet, which is radiated from the plasma, at the emission part, a trap provided between the excitation unit and the optical condensing unit, a first positioning mechanism connected to the trap and configured to adjust at least one of a position and an angle of the trap, and a measuring unit configured to measure a far field distribution image of the plasma on the basis of the extreme ultraviolet which is emitted from the emission part, thereby to operate the first positioning mechanism.

14 Claims, 6 Drawing Sheets

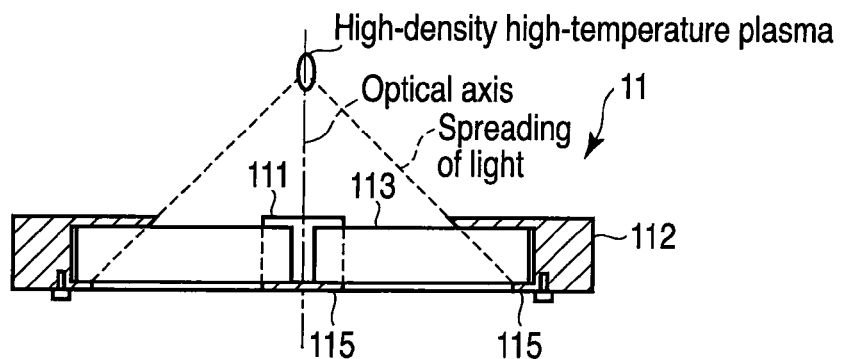
F I G. 2A
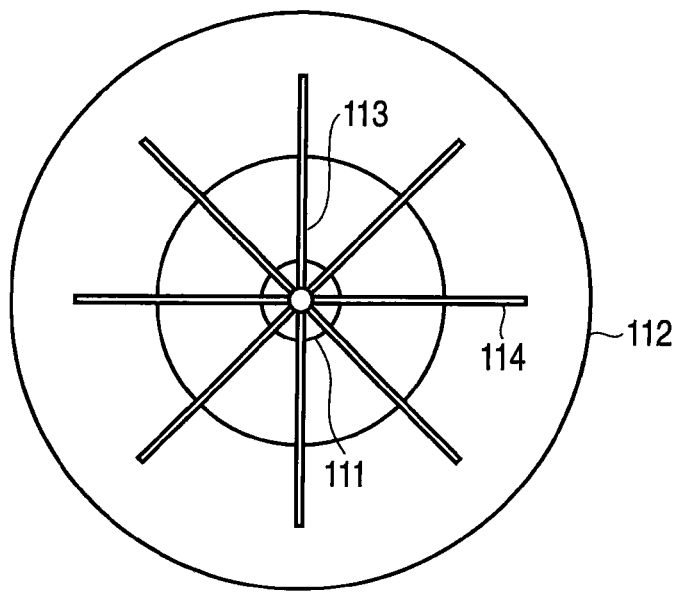
F I G. 2B
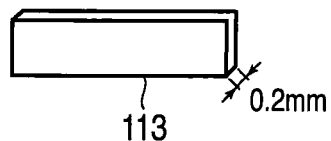
F I G. 2C
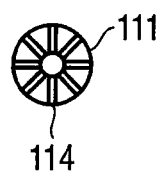
F I G. 2D

EXTREME ULTRAVIOLET LIGHT SOURCE APPARATUS AND METHOD OF ADJUSTING THE SAME

CROSS-REFERENCE TO RELATED APPLICATIONS

This application is based upon and claims the benefit of priority from prior Japanese Patent Application No. 2009-020690, filed Jan. 30, 2009, the entire contents of which are incorporated herein by reference.

BACKGROUND OF THE INVENTION

1. Field of the Invention

The present invention relates to an extreme ultraviolet light source apparatus functioning as, for example, a light source for semiconductor exposure, and a method of adjusting the extreme ultraviolet light source apparatus.

2. Description of the Related Art

In recent years, as a light source for semiconductor exposure, there has been proposed an extreme ultraviolet light source apparatus (EUV light source apparatus) which emit extreme ultraviolet (EUV) light with a wavelength of 13 to 14 nm, in particular, with a wavelength of 13.5 nm. An example of the EUV light source apparatus is a discharge produced plasma (DPP) type EUV light source apparatus (see, e.g. "Present State and Future Prospect of Research of EUV (Extreme Ultraviolet) Light Source for Lithography", Jp. Plasma Fusion Res. Vol. 79, No. 3, P219-260, March 2003).

This DPP type EUV light source apparatus comprises, for example, a container functioning as a main body, a first main discharge electrode (cathode) with an annular shape and a second main discharge electrode (anode) with an annular shape, which are disposed substantially coaxially within the container, and an EUV condensing mirror which is disposed under the first and second main discharge electrodes. In a method of emitting EUV light, a large pulsating current is caused to flow between the first and second main discharge electrodes, for example, in the state in which an EUV radiation seed is introduced in the container. Thereby, the EUV radiation seed, which is introduced in the vicinity of the first and second main discharge electrodes, is heated and excited, and a high-density high-temperature plasma is generated in the vicinity of the first and second main discharge electrodes. EUV light, which is radiated from the high-density high-temperature plasma, is reflected by the EUV condensing mirror and is emitted to an exposing device.

However, if the high-density high-temperature plasma is generated, such a problem arises that debris, for instance, metal powder, which is produced by sputtering by the high-density high-temperature plasma, or debris occurring from the radiation seed, may damage the EUV condensing mirror. In order to prevent damage to the EUV condensing mirror, a debris trap for passing only EUV light is formed between the first and second main discharge electrodes and the EUV condensing mirror. As the debris trap, for example, a structure called "foil trap" has been proposed (see, e.g. Jpn. PCT National Publication No. 2004-214656).

On the other hand, in some cases, the high-density high-temperature plasma, which is the light source of EUV light, may melt and deform the nearby first and second main discharge electrodes, and may vary the position of electric field. As a result, the position of generation of the high-density high-temperature plasma shifts and the position of the luminescent point of EUV light that is emitted from the plasma may deviate from the central position of the foil trap. Hence, such a problem occurs that the amount of light which can pass through the foil trap decreases.

Thus, in the conventional EUV light source apparatus, it is difficult to obtain EUV light of a stable and desired light amount.

BRIEF SUMMARY OF THE INVENTION

According to a first aspect of the present invention, there is provided an extreme ultraviolet light source apparatus comprising: a main body including a supply section to which an extreme ultraviolet radiation seed is supplied, and an emission part configured to emit extreme ultraviolet light; an excitation unit provided in the main body and configured to generate a plasma by exciting the extreme ultraviolet radiation seed; an optical condensing unit provided in the main body and configured to converge extreme ultraviolet light, which is radiated from the plasma, at the emission part; a trap provided between the excitation unit and the optical condensing unit; a first positioning mechanism connected to the trap and configured to adjust at least one of a position and an angle of the trap; and a measuring unit configured to measure a far field distribution image of the plasma on the basis of the extreme ultraviolet light which is emitted from the emission part, thereby to operate the first positioning mechanism.

According to a second aspect of the present invention, there is provided a method of adjusting an extreme ultraviolet light source apparatus, comprising: generating a plasma by exciting an extreme ultraviolet radiation seed by an excitation unit; converging extreme ultraviolet light, which is radiated from the plasma via a trap, by an optical condensing unit, and emitting the converged extreme ultraviolet light from an emission part; measuring a far field distribution image of the plasma on the basis of the converged extreme ultraviolet light which is emitted; and adjusting at least one of a position and an angle of the trap on the basis of the far field distribution image which is measured.

BRIEF DESCRIPTION OF THE SEVERAL VIEWS OF THE DRAWING

FIG. 2A is a cross-sectional view schematically showing a part of the structure of the extreme ultraviolet light source apparatus according to the embodiment, FIG. 2B is a bottom view schematically showing a part of the structure of the extreme ultraviolet light source apparatus according to the embodiment, FIG. 2C is a perspective view showing a part in FIG. 2A and FIG. 2B, and FIG. 2D is a plan view showing a part in FIG. 2A and FIG. 2B;

DETAILED DESCRIPTION OF THE INVENTION

Embodiments of the present invention will now be described in detail with reference to the accompanying drawings. In each embodiment, a description is given of a DPP type EUV light source apparatus which makes use of EUV light that is radiated from a high-density high-temperature plasma which is generated by electric current driving.

Embodiment

Figure 1:
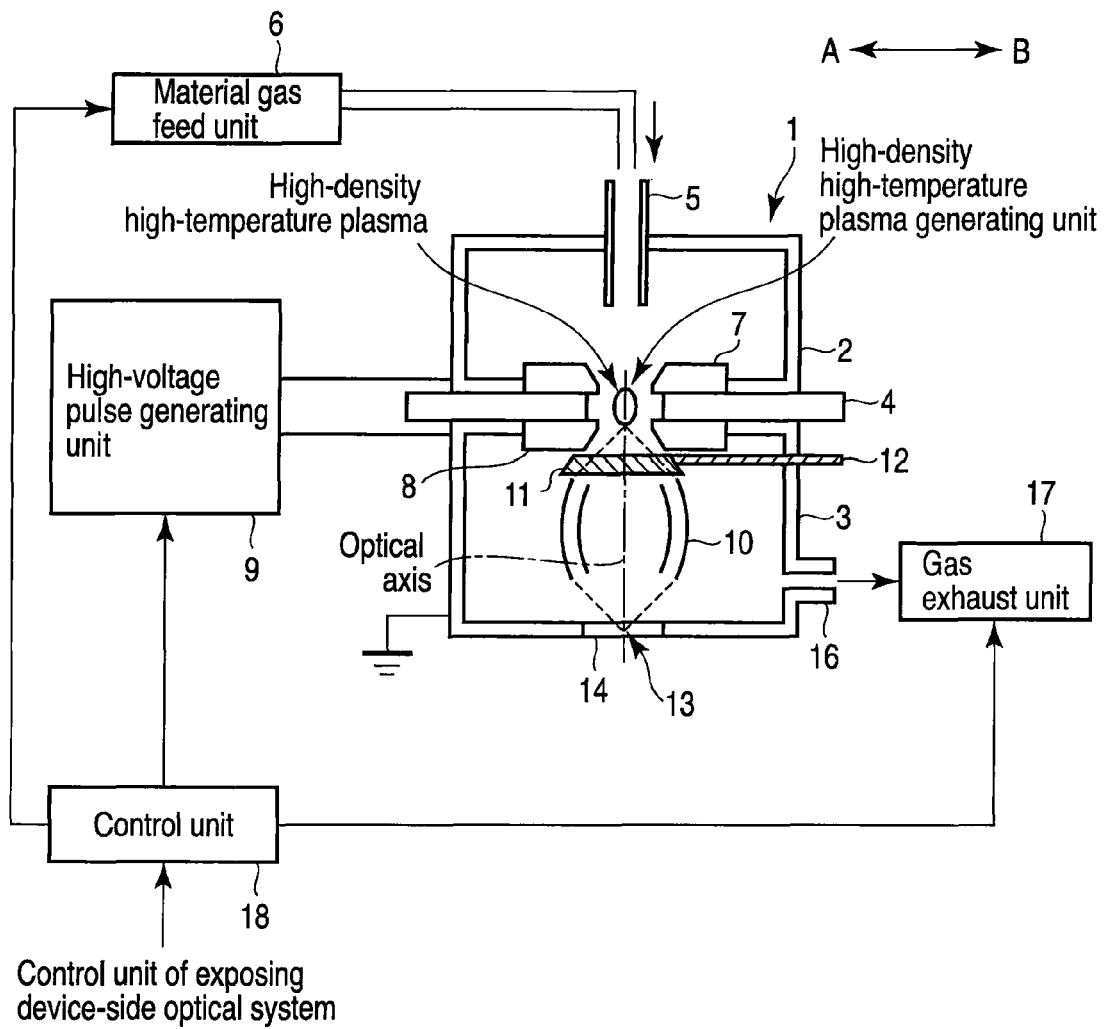
FIG. 1 schematically shows the structure of an extreme ultraviolet light source apparatus according to an embodiment of the present invention.

Referring to FIG. 1, FIG. 2A, FIG. 2B, FIG. 2C, FIG. 2D and FIG. 3, a description is given of the outline of the basic structure and operation of an extreme ultraviolet light source apparatus according to the embodiment. FIG. 1 schematically shows the structure of the extreme ultraviolet light source apparatus at the time of exposure.

As shown in FIG. 1, a main body 1 of the DPP type EUV light source apparatus comprises a first container 2 which is formed of an electrically conductive material, a second container 3 which is formed of an electrically conductive material, and an annular insulating member 4 which insulates the first container 2 and second container 3 from each other. An opening is formed in a bottom part of the first container 2 and an opening is formed in an upper part of the second container 3. The first container 2 and the second container 3 communicate with each other via the openings.

A gas introducing port 5 is provided at an upper central part of the first container 2. A material gas feed unit 6 for feeding a material gas, which is an EUV radiation seed, is connected to the first container 2 via the gas introducing port 5.

The second container 3 is provided with a pressure monitor (not shown) for monitoring the pressure within the container (the pressure in a high-density high-temperature plasma generating unit). A gas exhaust port 16 is provided in a side surface of the second container 3. A gas exhaust unit 17, which includes gas exhaust means, such as a vacuum pump, for adjusting the pressure in the high-density high-temperature plasma generating unit and exhausting gas in the main body 1, is connected to the gas exhaust port 16. Thereby, the first container 2 and second container 3 are kept in a vacuum state.

A first main discharge electrode (cathode) 7 having an annular shape is provided along the opening at the bottom part of the first container 2, and a second main discharge electrode (anode) 8 having an annular shape is provided along the opening at the upper part of the second container 3. The first main discharge electrode 7 and second main discharge electrode 8 are insulated by the insulating member 4. The second container 3 and second main discharge electrode 8 are grounded. The annular first main discharge electrode 7, second main discharge electrode 8 and insulating member 4 are substantially coaxially disposed. The first main discharge electrode 7 and second main discharge electrode 8 are formed of a high-melting-point metal such as tungsten, molybdenum or tantalum. The insulating member 4 is formed of, for example, silicon nitride, aluminum nitride, or diamond.

A high-voltage pulse generating unit 9, which supplies power to the first main discharge electrode 7 and second main discharge electrode 8, is connected to the first main discharge electrode 7 and second main discharge electrode 8. A high-density high-temperature plasma is generated in the vicinity of the center of the first main discharge electrode 7 and second main discharge electrode 8.

In the second container 3, a plurality of EUV condensing mirrors 10 with different diameters are provided as an optical condensing unit which condenses EUV light. Each EUV condensing mirror 10 is, for example, a Wolter mirror comprising a hyperboloidal upper part and a paraboloidal lower part. The plural EUV condensing mirrors 10 are arranged, with their rotational center axes being aligned such that their focal points substantially agree. The EUV condensing mirror 10 is formed by finely coating a metal, such as ruthenium (Ru), molybdenum (Mo), rhodium (Rh), etc., on the reflective surface of a base material with a smooth surface of, e.g. nickel (Ni), thereby to ensure good reflection of EUV light with an incident angle of 0° to 25°.

A foil trap 11 is provided between the second main discharge electrode 8 and EUV condensing mirrors 10 within the second container 3. A first positioning mechanism 12 is connected to the foil trap 11. By using the first positioning mechanism 12, the position and angle of the foil trap 11 can be adjusted from the outside of the second container 3. Specifically, the foil trap 11 is movable in a plane perpendicular to the rotational center axis (optical axis) of the EUV condensing mirror 10, along a right-and-left direction of the plane of FIG. 1 and a direction perpendicular to the plane of FIG. 1. The first positioning mechanism 12 is, for example, a screw bolt which is engaged with the second container 3. One end of the screw bolt is rotatably held on a part of the foil trap 11. Specifically, a screw hole, such as a nut, is provided on a side surface of the second container 3, and the screw bolt is engaged in this screw hole. By rotating the screw bolt in one or the other direction, the screw bolt is advanced or retreated, relative to the second container 3, and the foil trap 11 is moved in the directions of arrows A and B shown in FIG. 3. EUV light, which has passed through the foil trap 11, is converged by the EUV condensing mirrors 10 at the center (intermediate convergence point 13) of a light emission part 14 which is provided at the bottom of the second container 3.

The light emission part 14 of EUV light includes wavelength selection means (optical filter), not shown, for selecting EUV light of a wavelength of, e.g. 13.5 nm. The EUV light, which is emitted from the light emission part 14, is guided to an exposing device-side optical system (not shown).

The exposing device-side optical system is usually configured such that a plurality of reflection mirrors are disposed on a single optical axis. The extreme ultraviolet light source apparatus of the present embodiment is connected to the exposing device-side optical system along the optical axis.

The extreme ultraviolet light source apparatus of the present embodiment includes a control unit 18. The control unit 18 controls the high-voltage pulse generating unit 9, material gas feed unit 6 and gas exhaust unit 17 on the basis of, e.g. an EUV emission instruction from a controller of the exposing device-side optical system (not shown).

For example, upon receiving the EUV emission instruction from the controller of the exposing device-side optical system, the control unit 18 controls the material gas feed unit 6. Thereby, the material gas for discharge (extreme ultraviolet radiation seed) is introduced from the material gas feed unit 6 into the first container 2 via the gas introducing port that is provided in the first container 2. This material gas is a substance which can produce, with high efficiency, a high-density high-temperature plasma that emits EUV light with a wavelength of 13.5 nm in the high-density high-temperature plasma generating unit. As the material gas, for example, use may be made of stannane ($SnH_4$), tin (Sn) and/or a tin (Sn) compound, or lithium (Li) and/or a lithium (Li) compound. The material gas, which has been introduced, flows from the first container 2 to the second container 3, and reaches the gas exhaust port 16. The material, which has reached the gas exhaust port 16, is exhausted to the outside of the second container 3 by the gas exhaust unit 17. On the basis of pressure data which is output from a pressure monitor (not shown), the control unit 18 controls the feed amount of the material gas from the material gas feed unit 6 and controls the exhaust amount of the gas by the gas exhaust unit 17, so that the pressure of the high-density high-temperature plasma generating unit within the first container 2 may become 1 to 20 Pa.

Next, in order to generate the high-density high-temperature plasma that emits EUV light, the control unit 18 controls the high-voltage pulse generating unit 9. The high-voltage pulse generating unit 9 applies a high-voltage pulse voltage of about +20 kV to −20 kV to the second container 3 and second main discharge electrode 8, which are grounded, and to the first container 2 and first main discharge electrode 7. If power is supplied to the first main discharge electrode 7 and second main discharge electrode 8, creeping discharge occurs on the surface of the insulating member 4, and the first main discharge electrode 7 and second main discharge electrode 8 are substantially short-circuited. Hence, a large pulsating current flows between the first main discharge electrode 7 and second main discharge electrode 8. Subsequently, by Joule heating by a pinch effect, a high-density high-temperature plasma is generated in a communication hole or in the vicinity of the communication hole, which is formed by the first main discharge electrode 7, insulating member 4 and second main discharge electrode 8. As a result, EUV light is radiated from the high-density high-temperature plasma.

The high-density high-temperature plasma generating unit is disposed in space or in the vicinity of the space, which is surrounded by the first main discharge electrode 7, second main discharge electrode 8 and insulating member 4.

The foil trap 11 including a plurality of plates is provided between the high-density high-temperature plasma and the EUV condensing mirrors 10. Thereby, the pressure between the high-density high-temperature plasma and the foil trap 11 increases. If the pressure increases, the density of the gas existing in the field (the material gas and, in the case of using a gas curtain, the gas of the gas curtain) increases. Hence, the collision between atoms of the gas and debris increases. With the repetition of collision, the kinetic energy of debris decreases. Thereby, the foil trap 11 captures debris and can suppress damage to the EUV condensing mirrors 10. The debris include debris, such as metal powder, which is generated when the metal (first main discharge electrode 7 and second main discharge electrode 8) in contact with the high-density high-temperature plasma is sputtered by the high-density high-temperature plasma, and debris due to the material gas (Sn or a compound thereof in the case of using $SnH_4$ as the material gas).

EUV light, which is radiated from the high-density high-temperature plasma, travels through the foil trap 11 and is reflected by the EUV condensing mirror 10. The EUV light reflected by the EUV condensing mirror 10 is converged at the light emission part 14 including the wavelength selection means (optical filter) which selects EUV light with a wavelength of, e.g. 13.5 nm.

FIG. 2A to FIG. 2D schematically show the basic structure of the foil trap 11.

As shown in FIG. 2A and FIG. 2B, an inner ring 111 and an outer ring 112 of the foil trap 11 are concentrically provided. As shown in FIG. 2A, the inside diameter of the outer ring 112 on the side of the EUV condensing mirror 10 is greater than the inside diameter of the outer ring 112 on the side of the first main discharge electrode 7 and second main discharge electrode 8, in accordance with spreading of EUV light that is radiated from the high-density high-temperature plasma. The inner ring 111 is provided with grooves 114 in an outwardly radiating fashion, in which plates 113 are inserted. The outer ring 112 is provided with grooves 114 in an inwardly radiating fashion, in which the plates 113 are inserted. The grooves 114 are formed in the thickness direction (i.e. the direction along the optical axis) of the inner ring 111 and outer ring 112. An annular hold plate 115 is attached by screwing to the inner ring 111 and outer ring 112, thereby to prevent the plates 113 from falling from the grooves 114. Thus, the plural planar plates 113 are radially arranged, with their both ends being supported by the inner ring 111 and outer ring 112. In addition, the planar plates 113 are provided such that their planes are parallel to the optical axis so as not to block the EUV light. The plate 113 is a thin plate member with a thickness of about 0.2 mm. The inner ring 111 and outer ring 112 are formed of a high-melting-point material such as molybdenum or tungsten. On the other hand, the outer ring 112 is formed of, e.g. stainless steel.

The inner ring 111 and outer ring 112 are provided with cooling water conduits (not shown) in which cooling water flows. The cooling water conduits are connected to a cooling water pipe (not shown). Cooling water, which is a cooling medium, is supplied from a cooling device (not shown), which is provided on the outside of the main body 1, to the cooling water conduits. Thereby, the inner ring 111 and outer ring 112 are cooled. In addition, the cooling water conduits support the inner ring 111 and outer ring 112.

As described above, the plates 113 are radially disposed. As shown in FIG. 2A, assume the case in which EUV light, which is generated from the high-density high-temperature plasma that is located on the center axis of the foil trap 11, enters the foil trap 11. In this case, that part of the plate 113 disposed in parallel to the direction of travel of EUV light, which part is perpendicular to the direction of travel of EUV light, is only the part in the thickness direction of the plate 113. Accordingly, the EUV light can pass through the foil trap 11 without being blocked by the plates 113. On the other hand, the plate 113 that is disposed not in parallel to the direction of travel of EUV light has such characteristics that EUV light is blocked by the side surface (planar part) of this plate 113 and the amount of light passing through the foil trap 11 decreases. In other words, in the case where the position of generation of EUV light is on the center axis of the foil trap 11, the amount of light passing through the foil trap 11 becomes maximum. However, as the position of generation of EUV light deviates more from the center axis of the foil trap 11, the amount of EUV light passing through the foil trap 11 becomes smaller by the amount of light blocked by the side surface of the plate 113.

Figure 3:
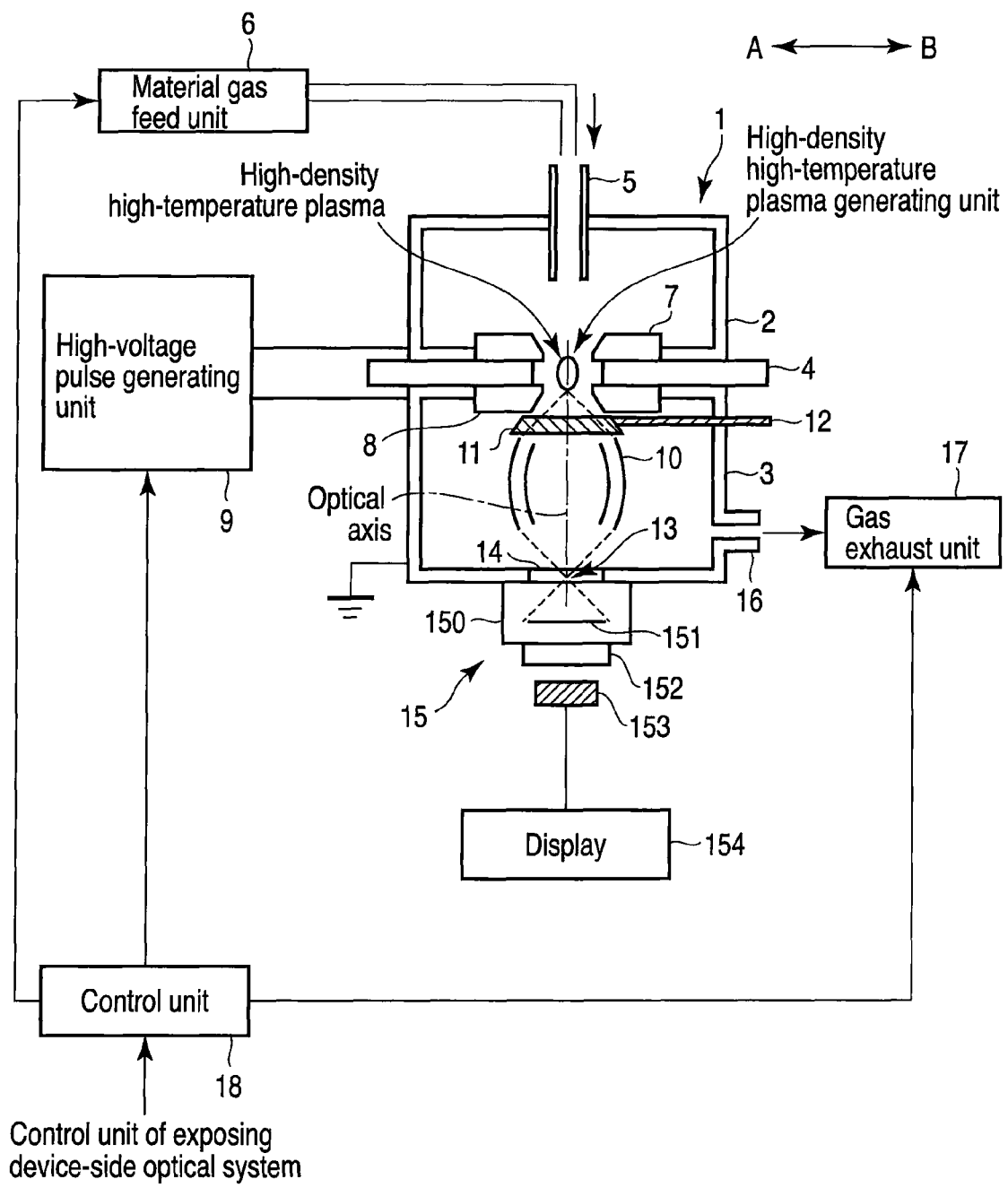
FIG. 3 schematically shows the structure of the extreme ultraviolet light source apparatus according to the embodiment at a time of measurement.

With reference to FIG. 3, the basic structure and operation of a measuring unit 15 are described.

FIG. 3 schematically shows the state in which the measuring unit 15 is mounted at the light emission part 14 of the second container 3. The measuring unit 15 includes a measuring container 150 which is provided at the light emission part 14 of the second container 3. The second container 3 and measuring container 150 are both kept in a vacuum state. For example, a fluorescent plate 151, which converts EUV light emitted from the light emission part 14 to visible light, is disposed in the measuring container 150. The fluorescent plate 151 converts a far field image of the EUV light to an image of visible light. The far field image (far field distribution image) is an image which is obtained when an image from the high-density high-temperature plasma is observed at a distance from the intermediate convergence point 13. A window (view port) 152, which enables observation of the fluorescent plate 151 in the measuring container 150 from the outside, is provided in the measuring container 150. A CCD camera 153, for instance, is provided so as to be opposed to the view port 152. Using the CCD camera 153, the far field image that is formed on the fluorescent plate 151 can be photographed. The CCD camera 153 is connected to, for example, a display 154 or a memory (not shown), and the state of the far field image can be displayed and recorded. In short, the measuring unit 15 measures, for example, the amount of light or the amount of shadow of EUV light from the far field image of the high-density high-temperature plasma.

The measuring unit 15 is configured to be detachably attached to the second container 3, and can measure the amount of light, etc., where necessary. Although the measuring unit 15 is mounted on the second container 3, the measuring unit 15 may be disposed within the exposing device-side optical system and may be configured to be movable on the optical axis of EUV light or outside the optical axis, thereby executing measurement on the exposing device side.

Next, referring to FIG. 3, a description is given of the alignment and measuring operation of the extreme ultraviolet light source apparatus.

To begin with, the positions of the first main discharge electrode 7 and second main discharge electrode 8 are adjusted, thereby aligning the position of generation of the high-density high-temperature plasma with the optical axis of the exposing device-side optical system. Then, EUV light, which is radiated from the high-density high-temperature plasma, is converged at the intermediate convergence point 13 by the EUV condensing mirrors 10. The position and angle of the EUV condensing mirrors 10 are adjusted so that the intermediate convergence point 13 may overlap the optical axis of the exposing device-side optical system. At last, the position and angle of the foil trap 11 are adjusted so that the far field image of the high-density high-temperature plasma in the vicinity of the intermediate convergence point 13, which is observed by the measuring unit 15, may have a predetermined distribution and light amount. By these adjustments, such alignment has been carried out that the EUV light, which can be extracted from the light source apparatus, is taken out to the maximum.

Figures 4A, 4B:
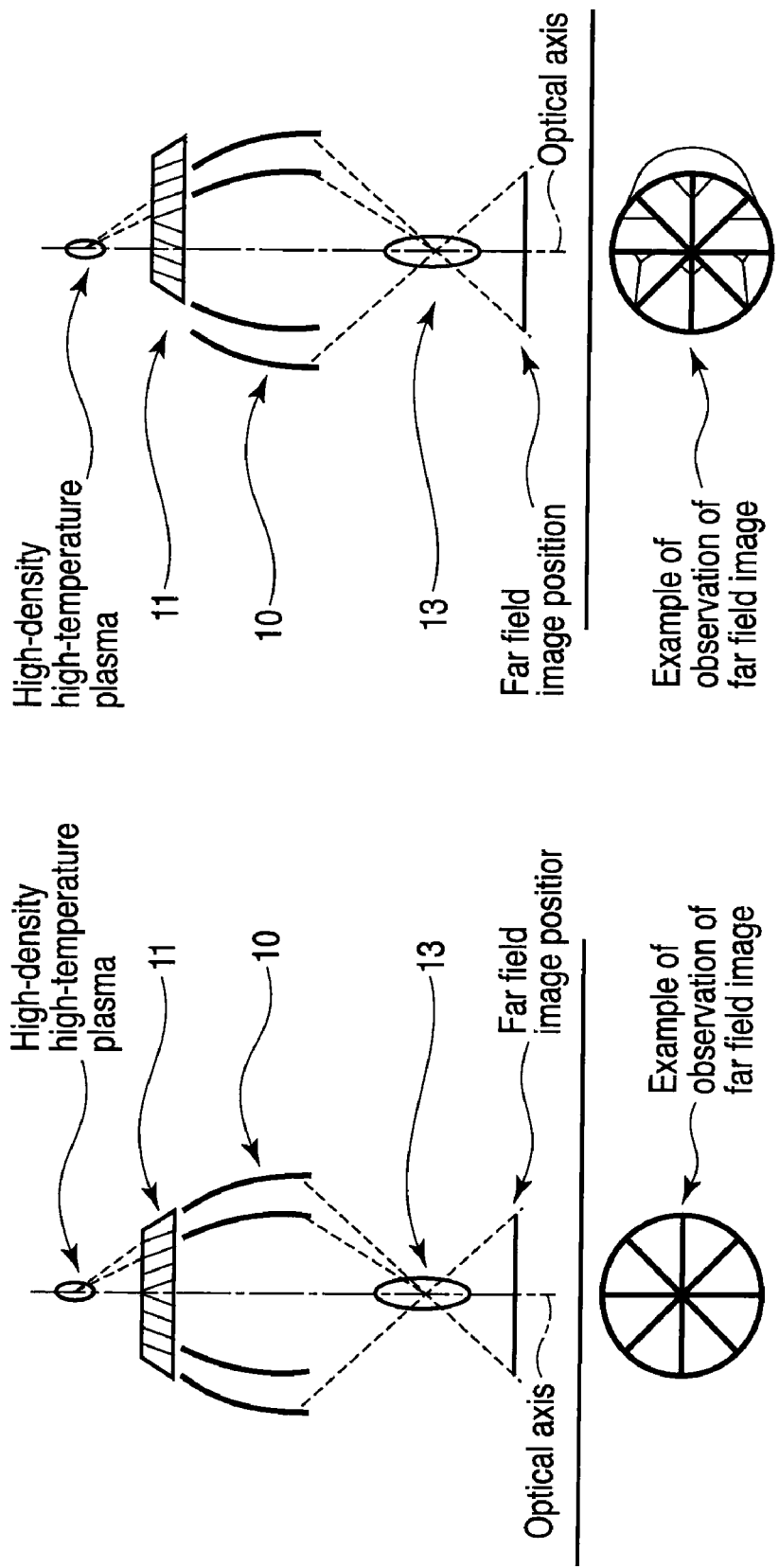
FIG. 4A and FIG. 4B schematically illustrate a part of the operation of the extreme ultraviolet light source apparatus according to the embodiment.

FIG. 4A and FIG. 4B show the positional relationship between the high-density high-temperature plasma, foil trap 11 and EUV condensing mirrors 10, which are shown in FIG. 1. FIG. 4A shows the case in which the optical axis of the high-density high-temperature plasma agrees with the center axis of the foil trap 11 and EUV condensing mirrors 10.

In this case, the EUV light, which is emitted from the high-density high-temperature plasma, passes through the foil trap 11, is reflected by the EUV condensing mirrors 10, and is converted at the intermediate convergence point 13 that is the convergence position. Ideally, in this manner, the optical axis of the high-density high-temperature plasma is disposed to be coaxial with the center axis of the foil trap 11 and EUV condensing mirrors 10. The far field image in this case includes a shadow of the foil trap 11.

In the ideal case shown in FIG. 4A, the EUV light, which is radiated from the high-density high-temperature plasma, passes through the foil trap 11 in parallel to the plates 113 which constitute the foil trap 11. Thus, the EUV light reaches the intermediate convergence point 13 in the state in which the decrease in light amount is suppressed. Therefore, the shadow of the foil trap 11 is hardly observed in the far field image.

On the other hand, FIG. 4B shows the case in which the position of the foil trap 11 is displaced from the optical axis of the high-density high-temperature plasma and the center axis of the EUV condensing mirrors 10. In this case, since the position of the foil trap 11 is horizontally displaced from the optical axis, the EUV light, which is radiated from the high-density high-temperature plasma, is blocked by the plates 113 which constitute the foil trap 11. Thus, the EUV light reaches the intermediate convergence point 13 in the state in which the light amount is decreased. In addition, the angle of view of the side surface of each plate 113 constituting the foil trap 11 varies depending on the angle of view of the foil trap 11 from the high-density high-temperature plasma. Thus, the amount of decrease of light amount varies depending on the circumferential direction of the foil trap 11. As a result, as shown in the Figure, a far field image, which is dark in the up-and-down direction and is slightly bright in the right-and-left direction, is formed.

The measuring unit 15 measures the amount of EUV light on the basis of the far field image. The first positioning mechanism 12 is adjusted to set the position of the foil trap 11 at the optimal position, for example, so that the measured light amount may become maximum. In other words, the position of the foil trap 11 is adjusted at the optimal position so as to minimize the shadow of the foil trap 11. Specifically, for example, while viewing the image that is photographed by the CCD camera 153 and displayed on the display 154, the first positioning mechanism 12 is operated to adjust the foil trap 11 at the optimal position.

Thereby, such alignment can be carried out that the EUV light, which can be extracted from the light source apparatus of the present embodiment, is taken out to the maximum.

Thereafter, the measuring unit 15 is removed from the light emission part 14 of the second container 3, and the exposing device-side optical system is connected to the light emission part 14 of the second container 3, thereby to perform exposure.

According to the above-described embodiment, the measuring unit 15 for measuring the EUV light that is generated from the high-density high-temperature plasma is disposed at the light emission part 14 of the main body 1. The first positioning mechanism 12 for adjusting the position and angle of the foil trap 11 is connected to the foil trap 11. The position of the foil trap 11 is adjusted by using the first positioning mechanism 12 so that the amount of EUV light that is measured by the measuring unit 15 may become maximum. Thus, even in the case where the position of generation of the high-density high-temperature plasma is displaced from the center of the foil trap 11, the foil trap 11 can be set at the optimal position relative to the position of generation of the plasma. Therefore, the necessary amount of light can be obtained.

In addition, according to the above-described embodiment, the position of the foil trap 11 can be adjusted from the outside of the main body 1. Thus, there is no need to adjust the foil trap 11 by opening the main body 1. As a result, the position of the foil trap 11 can exactly be adjusted without disturbing the gas pressure condition within the main body 1.

Since the first main discharge electrode 7 and second main discharge electrode 8 are consumable parts, it is necessary to periodically replace the first main discharge electrode 7 and second main discharge electrode 8. The replacement of the first main discharge electrode 7 and second main discharge electrode 8 is determined, depending on conditions such as the decrease in light amount, asymmetry of a far light distribution, or wear of the first main discharge electrode 7 and second main discharge electrode 8. In particular, if non-uniform wear occurs on the first main discharge electrode 7 and second main discharge electrode 8, the position of generation of the high-density high-temperature plasma would vary. As a result, the EUV light is blocked by the foil trap 11, the far field image becomes asymmetric, and the light amount decreases. In this case, too, by adjusting the position of the foil trap 11, the first main discharge electrode 7 and second main discharge electrode 8 can stably be used without opening the main body 1 which is in the vacuum state.
(Modification 1)

Figure 5:
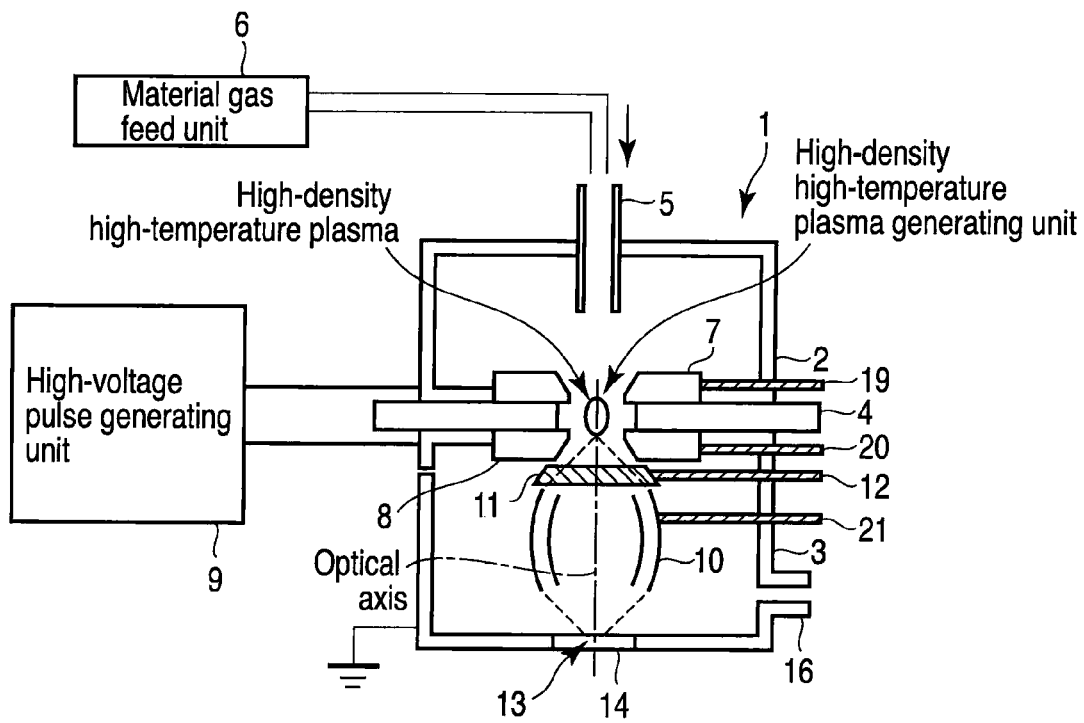
FIG. 5 schematically shows the structure of an extreme ultraviolet light source apparatus according to Modification 1 of the embodiment of the present invention.

FIG. 5 schematically shows the basic structure of Modification 1 of the present embodiment. In FIG. 5, the parts common to those in FIG. 1 are denoted by like reference numerals, and only different parts are described.

In the above-described embodiment, the foil trap 11 is configured to be movable. On the other hand, in Modification 1, as shown in FIG. 5, a second positioning mechanism 19 is connected to the first main discharge electrode 7, and a third positioning mechanism 20 is connected to the second main discharge electrode 8. The positions and angles of the first main discharge electrode 7 and second main discharge electrode 8 can be varied by the second positioning mechanism 19 and third positioning mechanism 20, respectively. The structure of each of the second positioning mechanism 19 and third positioning mechanism 20 is the same as the structure of the first positioning mechanism 12. The position of generation of the high-density high-temperature plasma can be adjusted by adjusting the position and angle of one or both of the first main discharge electrode 7 and second main discharge electrode 8 by one or both of the second positioning mechanism 19 and third positioning mechanism 20.

Furthermore, a fourth positioning mechanism 21 is connected to the EUV condensing mirrors 10, and the position and angle of the EUV condensing mirrors 10 are variable. The fourth positioning mechanism 21 is similar to each of the first to third positioning mechanisms 12, 19 and 20. By the fourth positioning mechanism 21, the position and angle of the EUV condensing mirrors 10 can be adjusted, and the position of the far field image can be adjusted.

Figure 6:
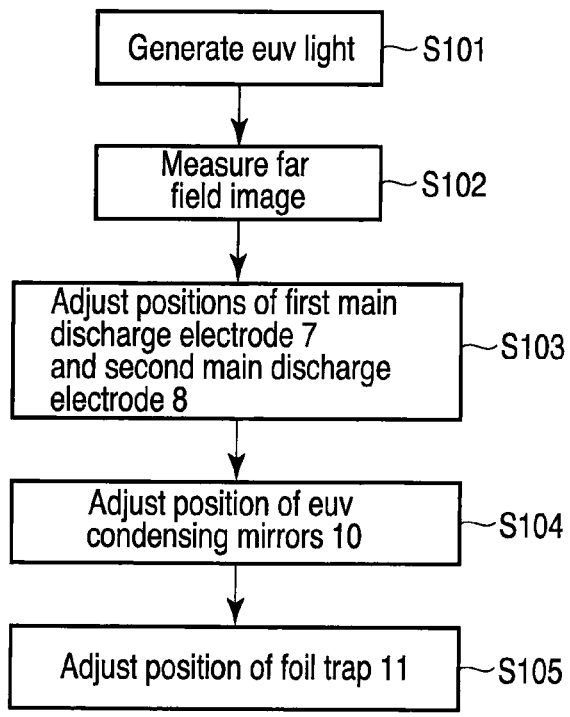
FIG. 6 schematically shows an adjusting method of the extreme ultraviolet light source apparatus according to Modification 1 of the embodiment.

FIG. 6 is a flow chart illustrating a method of adjusting the first positioning mechanism 12, second positioning mechanism 19, third positioning mechanism 20 and fourth positioning mechanism 21. When the alignment of the extreme ultraviolet light source apparatus is performed, the measuring unit 15 is amount at the light emission part 14 of the second container 3, as shown in FIG. 3. The alignment adjustment is executed by using the far field image, which is measured by the measuring unit 15.

To start with, as shown in FIG. 6, a high-density high-temperature plasma is generated in the main body 1, and EUV light is radiated from the high-density high-temperature plasma. The EUV light is emitted from the light emission part 14 (step S101). The far field image of the emitted EUV light is observed by the measuring unit 15 that is disposed near the light emission part 14. Specifically, the amount of light and the amount of shadow of EUV are measured from the far field image (step S102). Then, based on the measured far field image, the position of one or both of the first and second main discharge electrodes 7 and 8 is adjusted by using the second positioning mechanism 19 and third positioning mechanism 20. In this manner, the position of generation of the high-density high-temperature plasma is made to agree with the optical axis of the exposing device-side optical system (step S103). Next, the EUV light that is emitted from the high-density high-temperature plasma is converged at the intermediate convergence point 13 by the EUV condensing mirrors 10. Using the fourth positioning mechanism 21, the position and angle of the EUV condensing mirrors 10 are adjusted so that the intermediate convergence point 13 may overlap the optical axis of the exposing device-side optical system (step S104). At last, using the first positioning mechanism 12, the position and angle of the foil trap 11 are adjusted so that the far field image of the high-density high-temperature plasma in the vicinity of the intermediate convergence point 13, which is observed by the measuring unit 15, may have a predetermined distribution and light amount (step S105). By this adjusting method, such alignment has been completed that the EUV light can be taken out to the maximum.

The order of the alignment adjustment steps is not limited to that shown in FIG. 6. It is possible to perform only a part of the alignment adjustment steps shown in FIG. 6.

According to the above-described Modification 1, the second positioning mechanism 19 is connected to the first main discharge electrode 7, and the third positioning mechanism 20 is connected to the second main discharge electrode 8. Furthermore, the fourth positioning mechanism 21 is connected to the EUV condensing mirrors 10. On the basis of the far field image that is measured by the measuring unit 15, the positions of the first and second main discharge electrodes 7 and 8 and EUV condensing mirrors 10 can be adjusted by using the second, third and fourth positioning mechanisms 19, 20 and 21. Thus, even in the case where the position of generation of the high-density high-temperature plasma is displaced, the necessary amount of light can be obtained.

In addition, according to the above-described Modification 1, like the above-described embodiment, the position of the foil trap 11 can be adjusted from the outside of the main body 1. Thus, there is no need to adjust the foil trap 11 by opening the main body 1. As a result, the position of the foil trap 11 can exactly be adjusted without disturbing the gas pressure condition within the main body 1.
(Modification 2)

Figure 7:
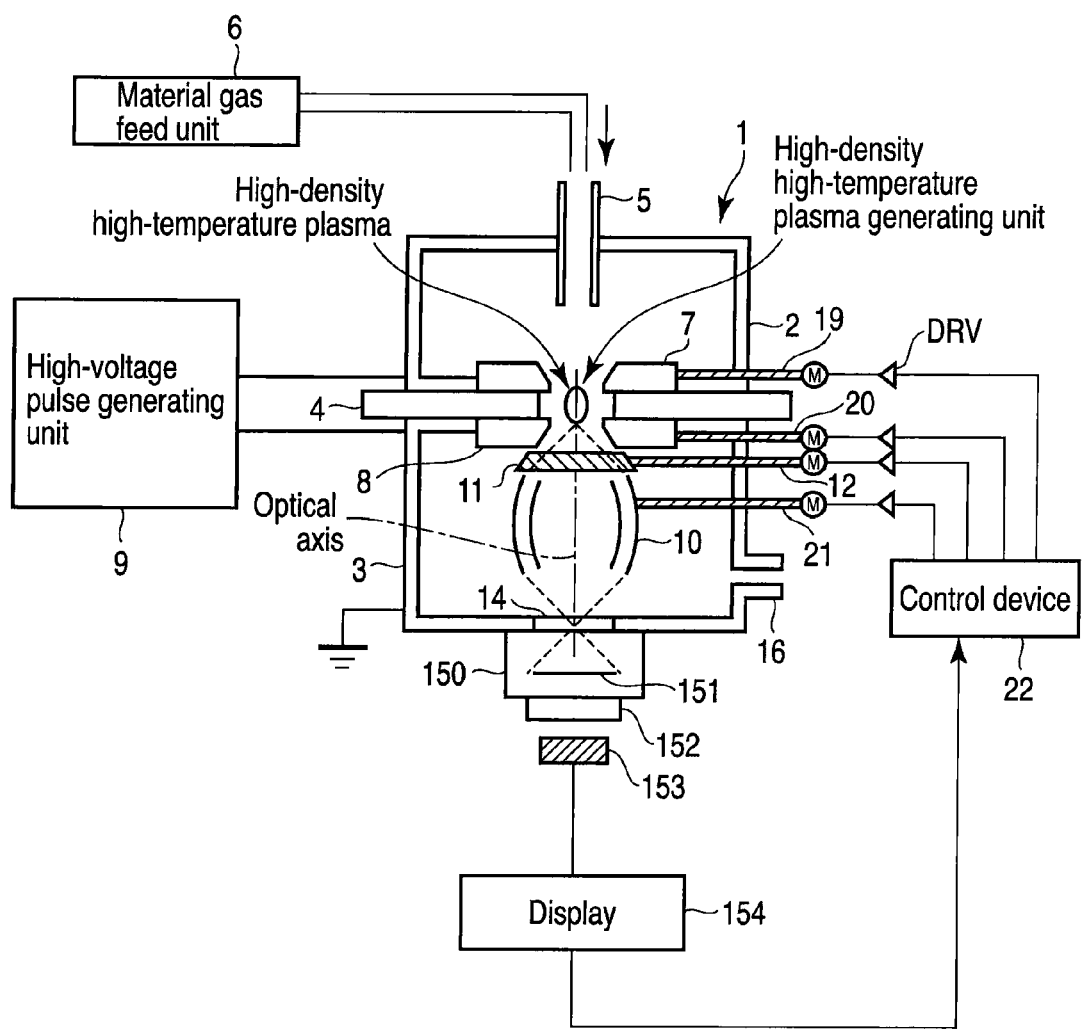
FIG. 7 schematically shows the structure of an extreme ultraviolet light source apparatus according to Modification 2 of the embodiment of the present invention.

FIG. 7 schematically shows the basic structure of an extreme ultraviolet light source apparatus of Modification 2 of the embodiment. In FIG. 7, the parts common to those of Modification 1 are denoted by like reference numerals, and only different parts are described. In Modification 1, the first, second, third and fourth positioning mechanisms 12, 19, 20 and 21 are operated, for example, in a manual method. On the other hand, in Modification 2, the first to fourth positioning mechanisms 12 and 19-21 are operated automatically by using a control device and driving devices.

As shown in FIG. 7, motors M and driving circuits DRV, which function as driving devices, are connected to the first positioning mechanism 12, second positioning mechanism 19, third positioning mechanism 20 and fourth positioning mechanism 21. All driving circuits DRV are connected to a control device 22. The control device 22 is connected to the measuring unit 15. On the basis of the data of the far field image of EUV light which is measured by the measuring unit 15, the control device 22 sends control signals to the respective motors. By receiving the control signals from the control device 22, the respective motors can execute positioning and can automatically perform the alignment which has been described in Modification 1. Specifically, according to the flow chart of FIG. 6, on the basis of the output signal of the measuring unit 15, the control device 22 controls the driving circuits DRV and motors, drives the first to fourth positioning mechanisms 12 and 19-21 and adjusts the positions of the foil trap 11, first and second main discharge electrodes 7 and 8 and EUV condensing mirrors 10, there by to maximize the amount of EUV light.

According to the above-described Modification 2, the motors M and driving circuits DRV are connected to the first positioning mechanism 12, second positioning mechanism 19, third positioning mechanism 20 and fourth positioning mechanism 21, and the respective driving circuits DRV are connected to the control device 22. Thus, by periodically collecting far field distribution images of EUV light by the measuring unit 15, the alignment can automatically be performed by using the control device 22.

Modification 2 is applicable to the embodiment shown in FIG. 3. Specifically, only the foil trap 11 may be moved via the control device 22, driving circuit DRV and motor M.

In each of the above embodiments, the first positioning mechanism 12 is connected to the foil trap 11, and the foil trap 11 is movable in the right-and-left direction on the plane of the Figures, which is perpendicular to the optical axis. However, for example, if a screw bolt is connected to the foil trap 11 in a direction perpendicular to the plane of the Figures, the foil trap 11 can be moved in a direction perpendicular to the plane of the Figures, which is perpendicular to the optical axis. In addition, a slit, which can be sealed, may be provided at a part of engagement between the screw bolt and the second container 3, and the screw bolt may be moved within the slit in a direction perpendicular to the plane of the Figures, thus being able to move the foil strap 11 in the direction perpendicular to the plane of the Figures. Moreover, a mechanism may be provided for rotating the foil trap 11 in accordance with the rotation of the screw bolt. Thereby, the foil trap 11 can be inclined about the axis of the screw bolt, and the angle of the foil trap 11 may be adjusted. This structure is applicable to the first and second main discharge electrodes 7 and 8 and EUV condensing mirrors 10.

Besides, although the DPP type EUV light source apparatus has been described in the embodiments, the same structure and adjustment method are applicable to a laser produced plasma (LPP) type EUV light source apparatus which utilizes EUV light that is radiated from a high-density high-temperature plasma which is generated by radiating a pulse laser to a target such as a solid, a liquid or a gas.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An extreme ultraviolet light source apparatus comprising:
    a main body including a supply section to which an extreme ultraviolet radiation seed is supplied, and an emission part configured to emit extreme ultraviolet light;
    an excitation unit provided in the main body and configured to generate a plasma by exciting the extreme ultraviolet radiation seed;
    an optical condensing unit provided in the main body and configured to converge extreme ultraviolet light, which is radiated from the plasma, at the emission part;
    a trap provided between the excitation unit and the optical condensing unit;
    a first positioning mechanism connected to the trap and configured to adjust at least one of a position and an angle of the trap; and
    a measuring unit configured to measure a far field distribution image of the plasma on the basis of the extreme ultraviolet light which is emitted from the emission part, thereby to operate the first positioning mechanism.

2. The apparatus of claim 1, further comprising a driving device connected to the first positioning mechanism.

3. The apparatus of claim 2, further comprising a control device connected to the measuring unit and configured to control the driving device on the basis of the far field distribution image of the plasma, which is measured by the measuring unit.

4. The apparatus of claim 3, wherein the control device is configured to control the driving device in a manner to maximize a light amount of the far field distribution image of the plasma.

5. The apparatus of claim 1, wherein the first positioning mechanism is adjustable and operable from an outside of the main body.

6. The apparatus of claim 1, further comprising:
    a second positioning mechanism connected to the excitation unit and configured to adjust at least one of a position and an angle of the excitation unit; and
    a third positioning mechanism connected to the optical condensing unit and configured to adjust at least one of a position and an angle of the optical condensing unit.

7. The apparatus of claim 6, further comprising a first driving device connected to the first positioning mechanism, a second driving device connected to the second positioning mechanism, and a third driving device connected to the third positioning mechanism.

8. The apparatus of claim 7, further comprising a control device connected to the measuring unit and configured to control the first, second and third driving devices on the basis of the far field distribution image of the plasma, which is measured by the measuring unit.

9. The apparatus of claim 8, wherein the control device is configured to control the first, second and third driving devices in a manner to maximize a light amount of the far field distribution image of the plasma, which is measured by the measuring unit.

10. The apparatus of claim 6, wherein the first, second and third positioning mechanisms are adjustable and operable from an outside of the main body.

11. A method of adjusting an extreme ultraviolet light source apparatus, comprising:
    generating a plasma by exciting an extreme ultraviolet radiation seed by an excitation unit;
    converging extreme ultraviolet light, which is radiated from the plasma via a trap, by an optical condensing unit, and emitting the converged extreme ultraviolet light from an emission part;
    measuring a far field distribution image of the plasma on the basis of the converged extreme ultraviolet light which is emitted; and
    adjusting at least one of a position and an angle of the trap on the basis of the far field distribution image which is measured.

12. The method of claim 11, wherein at least one of the position and the angle of the trap is adjusted in a manner to maximize a light amount of the far field distribution image which is measured.

13. The method of claim 11, wherein at least one of a position and an angle of at least one of the excitation unit and the optical condensing unit is adjusted on the basis of the far field distribution image which is measured.

14. The method of claim 13, wherein said at least one of the position and the angle of said at least one of the excitation unit and the optical condensing unit is adjusted in a manner to maximize a light amount of the far field distribution image which is measured.

* * * * *